(12) United States Patent
Chen et al.

(10) Patent No.: US 7,718,457 B2
(45) Date of Patent: May 18, 2010

(54) METHOD FOR PRODUCING A MEMS DEVICE

(75) Inventors: Thomas Chen, Cambridge, MA (US); Michael Judy, Wakefield, MA (US)

(73) Assignee: Analog Devices, Inc., Norwood, MA (US)

( * ) Notice: Subject to any disclaimer, the term of this patent is extended or adjusted under 35 U.S.C. 154(b) by 566 days.

(21) Appl. No.: 11/099,118

(22) Filed: Apr. 5, 2005

(65) Prior Publication Data
US 2006/0223291 A1 Oct. 5, 2006

(51) Int. Cl.
*H01L 21/00* (2006.01)

(52) U.S. Cl. .................. 438/52; 257/419; 257/E21.31; 216/2

(58) Field of Classification Search .............. 438/52; 257/419, E21.31; 216/2
See application file for complete search history.

(56) References Cited

U.S. PATENT DOCUMENTS

| | | | | |
|---|---|---|---|---|
| 4,744,863 A | | 5/1988 | Guckel et al. ............... 156/653 |
| 4,853,669 A | | 8/1989 | Guckel et al. ................ 338/4 |
| 4,996,082 A | | 2/1991 | Guckel et al. ............... 427/99 |
| 5,326,726 A | * | 7/1994 | Tsang et al. .................. 438/52 |
| 5,426,070 A | * | 6/1995 | Shaw et al. .................. 216/2 |
| 5,496,765 A | * | 3/1996 | Schwalke ................... 438/404 |
| 5,939,633 A | | 8/1999 | Judy ...................... 73/514.32 |
| 6,159,385 A | * | 12/2000 | Yao et al. ........................ 216/2 |
| 6,369,931 B1 | * | 4/2002 | Funk et al. ................... 359/223 |
| 6,440,766 B1 | * | 8/2002 | Clark .......................... 438/52 |
| 6,505,511 B1 | | 1/2003 | Geen et al. ................ 73/504.12 |
| 6,930,055 B1 | * | 8/2005 | Bhowmik et al. ........... 438/745 |
| 6,936,491 B2 | * | 8/2005 | Partridge et al. .............. 438/48 |
| 7,138,694 B2 | * | 11/2006 | Nunan et al. ................ 257/419 |
| 2002/0148807 A1 | * | 10/2002 | Zhao et al. ..................... 216/2 |

FOREIGN PATENT DOCUMENTS

WO  WO 01/32554  5/2001

OTHER PUBLICATIONS

Stahl et al. *Thin Film Encapsulation of Acceleration Sensors Using Polysilicon Sacrificial Layers*, The 12th International Conference on Solid State Sensors, Actuators and Microsystems, Jun. 8-12, 2003, 4 pages.
Klaus Meierewert *Invitation to Pay Additional Fees and Partial International Search*, Oct. 2, 2006, 8 pages.
Authorized Officer Philippe Foussier *International Search Report and Written Opinion of the International Searching Authority*, International Application No. PCT/US2006/012490, Dec. 20, 2006, 12 pages.

* cited by examiner

*Primary Examiner*—Steven J Fulk
(74) *Attorney, Agent, or Firm*—Sunstein Kann Murphy & Timbers LLP (57) ABSTRACT

A method of producing a MEMS device provides an apparatus having structure on a first layer that is proximate to a substrate. The apparatus has a space proximate to the structure. The method adds doped material to the space. The doped material dopes at least a portion of the first layer.

8 Claims, 9 Drawing Sheets

METHOD FOR PRODUCING A MEMS DEVICE

FIELD OF THE INVENTION

The invention generally relates to MEMS devices and, more particularly, the invention relates to methods for producing MEMS devices.

BACKGROUND OF THE INVENTION

Microelectromechanical systems ("MEMS," hereinafter "MEMS devices") are used in a wide variety of applications. For example, MEMS devices currently are implemented as microphones to convert audible signals to electrical signals, as gyroscopes to detect pitch angles of airplanes, and as accelerometers to selectively deploy air bags in automobiles. In simplified terms, such MEMS devices typically have a movable structure suspended from a substrate, and associated circuitry that both senses movement of the suspended structure and delivers the sensed movement data to one or more external devices (e.g., an external computer). The external device processes the sensed data to calculate the property being measured (e.g., pitch angle or acceleration).

During production, the structure on a MEMS device commonly is doped so it can cooperate effectively with the circuitry. This process generally involves applying doping material to the top surface of the structure prior to a release step (i.e., the step that frees the structure to move relative to the substrate). When the structure is relatively thick, (e.g., about ten microns or greater), however, the doping material, which was applied to the top surface, may not dope the opposite side of the structure to adequate levels. In addition, it also is very difficult to actually release the structure when it is so thick. If not appropriately doped or released, the MEMS device will not operate properly.

SUMMARY OF THE INVENTION

In accordance with one aspect of the invention, a method of producing a MEMS device provides an apparatus having structure on a first layer that is proximate to a substrate. The apparatus has a space proximate to the structure. The method adds doped material to the space. The doped material dopes at least a portion of the first layer.

In some embodiments, the method removes at least a portion of the doped material and a portion of the substrate to release the structure. Among other ways, the doped material and portion of the substrate may be removed by applying a dry gas phase etch to the doped material. At least a portion of the insulator also may be removed.

The apparatus may be a part of a silicon-on-insulator wafer. The method also may release the structure before adding the doped material. Moreover, the first layer may have a stationary portion, and the space may be between the structure and the stationary portion. Some embodiments add a barrier layer to the space before adding the doped material. In other embodiments, the space is between the first layer and the substrate.

In accordance with other aspects of the invention, a method of producing a MEMS device provides an intermediate multi-layer apparatus having an insulator layer between a first layer and a substrate. The first layer has structure that is unreleased relative to the substrate. The method positions a doped material through at least a portion of the first layer. The doped material dopes at least a portion of the first layer.

At least a portion of the doped material and a portion of the substrate subsequently may be removed to release the structure.

In accordance with another aspect of the invention, a method of producing a MEMS device provides an intermediate multi-layer apparatus having an insulator layer between a first layer and a substrate. The first layer has structure that is unreleased relative to the substrate. The method releases the structure, which includes removing a portion of the substrate. The first layer may have a space proximate to the structure into which etching material may be directed. In some embodiments, the method adds material to the space and removes at least a portion of the material from the space. Moreover, the material may be doped to dope at least a portion of the first layer.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, a method of forming a MEMS device dopes structure by positioning a doped material through at least a portion of a layer having the structure. The majority of this doped material preferably is removed before the MEMS device is fully formed. Moreover, rather than releasing structure by removing insulator material in an insulator layer of an silicon-on-insulator wafer, other embodiments remove a portion of the substrate supporting the structure. Details of these and other embodiments are discussed below.

Figure 1:
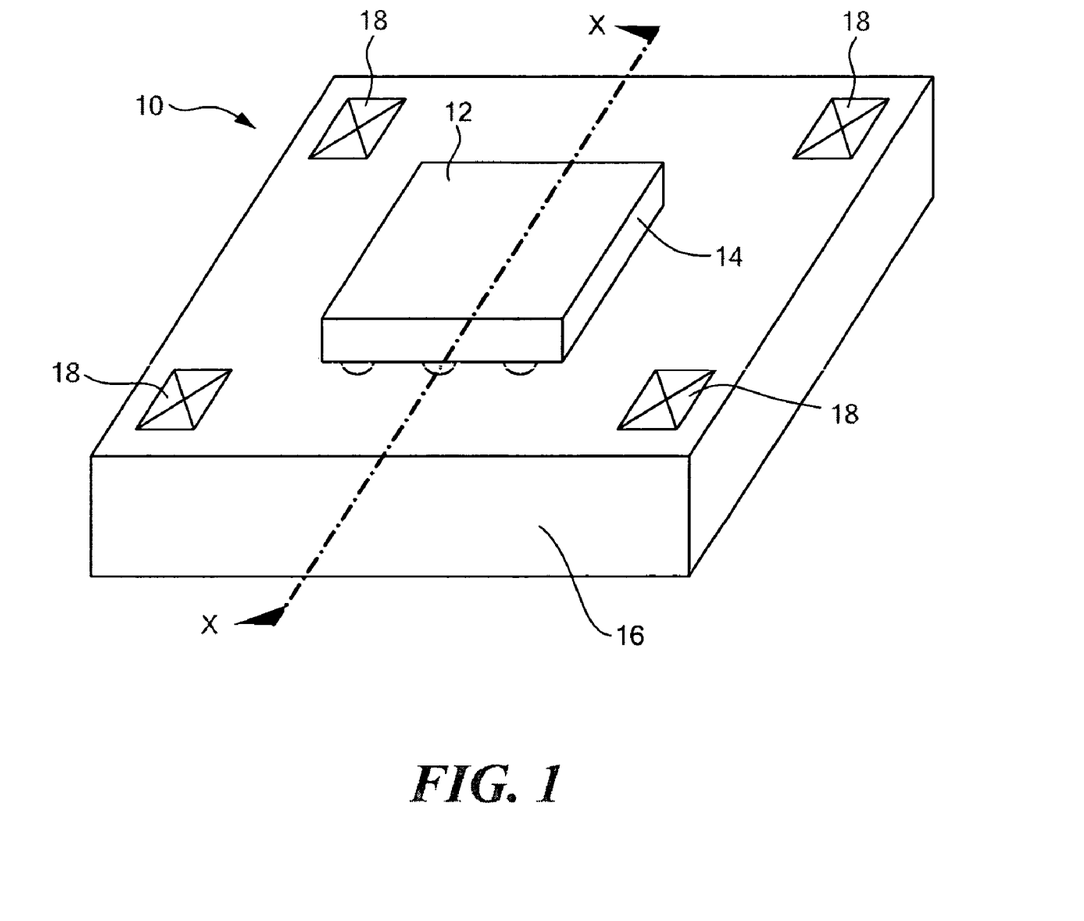
FIG. 1 schematically shows an exemplary MEMS device that can be formed in accordance with illustrative embodiments of the invention.

FIG. 1 schematically shows an exemplary MEMS system 10 that can be formed in accordance with illustrative embodiments of the invention. The MEMS system 10 includes a MEMS device 12 formed from a silicon-on-insulator wafer 20 ("SOI," shown in cross-section in subsequent figures) and packaged within a conventional ceramic package 14. The package 14 is coupled with a circuit board 16 having interconnects 18 to electrically communicate with an external device, such as a computer.

The MEMS device 12 may implement any conventionally known functionality commonly implemented on a MEMS device, such as an inertial sensor. For example, the MEMS device 12 may be a gyroscope or an accelerometer. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference.

Although the packaged MEMS device 12 is discussed above as an inertial sensor, principles of illustrative embodiments can apply to other MEMS devices, such as pressure sensors and microphones. Accordingly, discussion of an inertial sensor is exemplary and not intended to limit the scope of various embodiments of the invention.

Moreover, alternative embodiments include MEMS devices formed by processes other than SOI. For example, conventional surface micromachining ("SMM") techniques may form the released MEMS device. As known by those skilled in the art, surface micromachining techniques build material layers on top of a substrate 26 (e.g., a single crystal wafer) using additive and subtractive processes. As a further example, conventional SCREAM processes can form the MEMS device 12. SCREAM is the acronym for "single crystal reactive etching and metallization" processes, developed at Cornell University in 1993.

Figure 2:
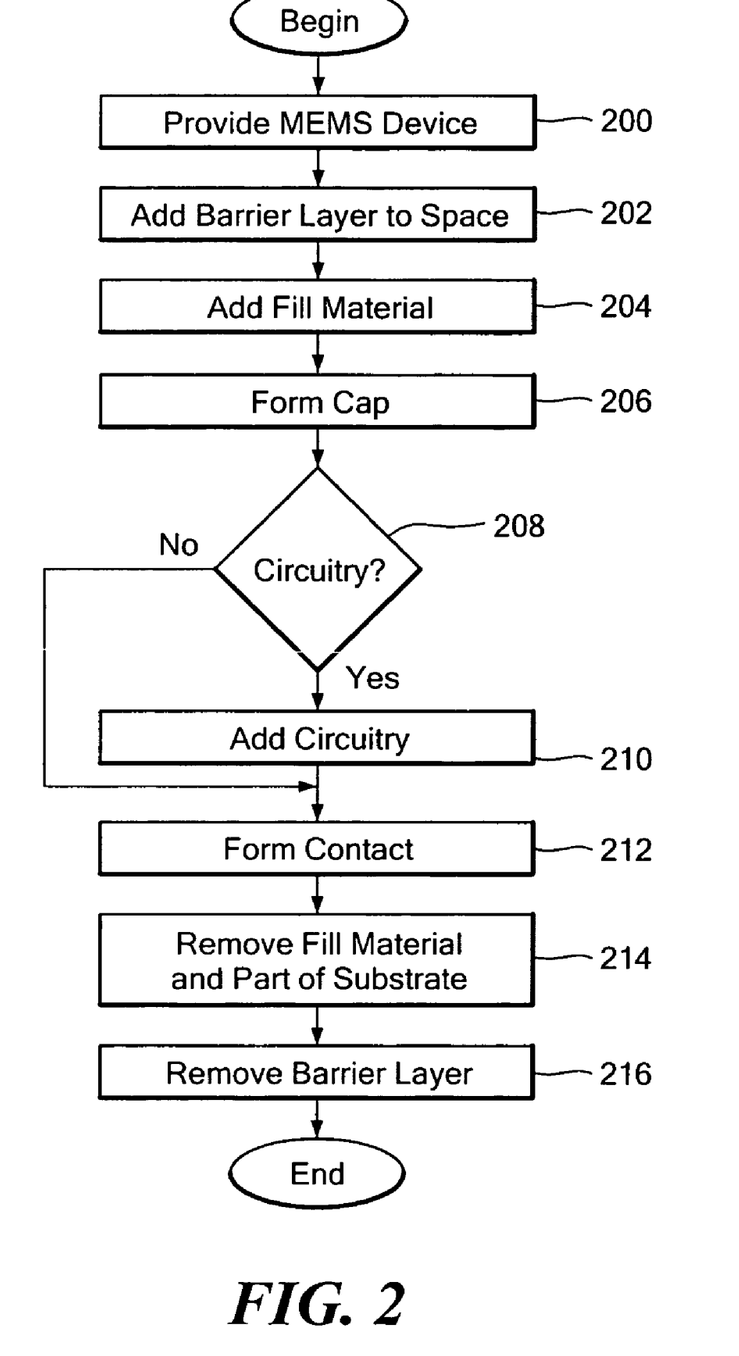
FIG. 2 shows a process of forming a MEMS device in accordance with illustrative embodiments of the invention.

FIG. 2 shows a process of forming a MEMS device, such as the MEMS device 12 shown in FIG. 1, in accordance with illustrative embodiments of the invention. FIGS. 3-9 illustrate the MEMS device 12 at various stages of development as discussed with regard to FIG. 2.

Figure 3:
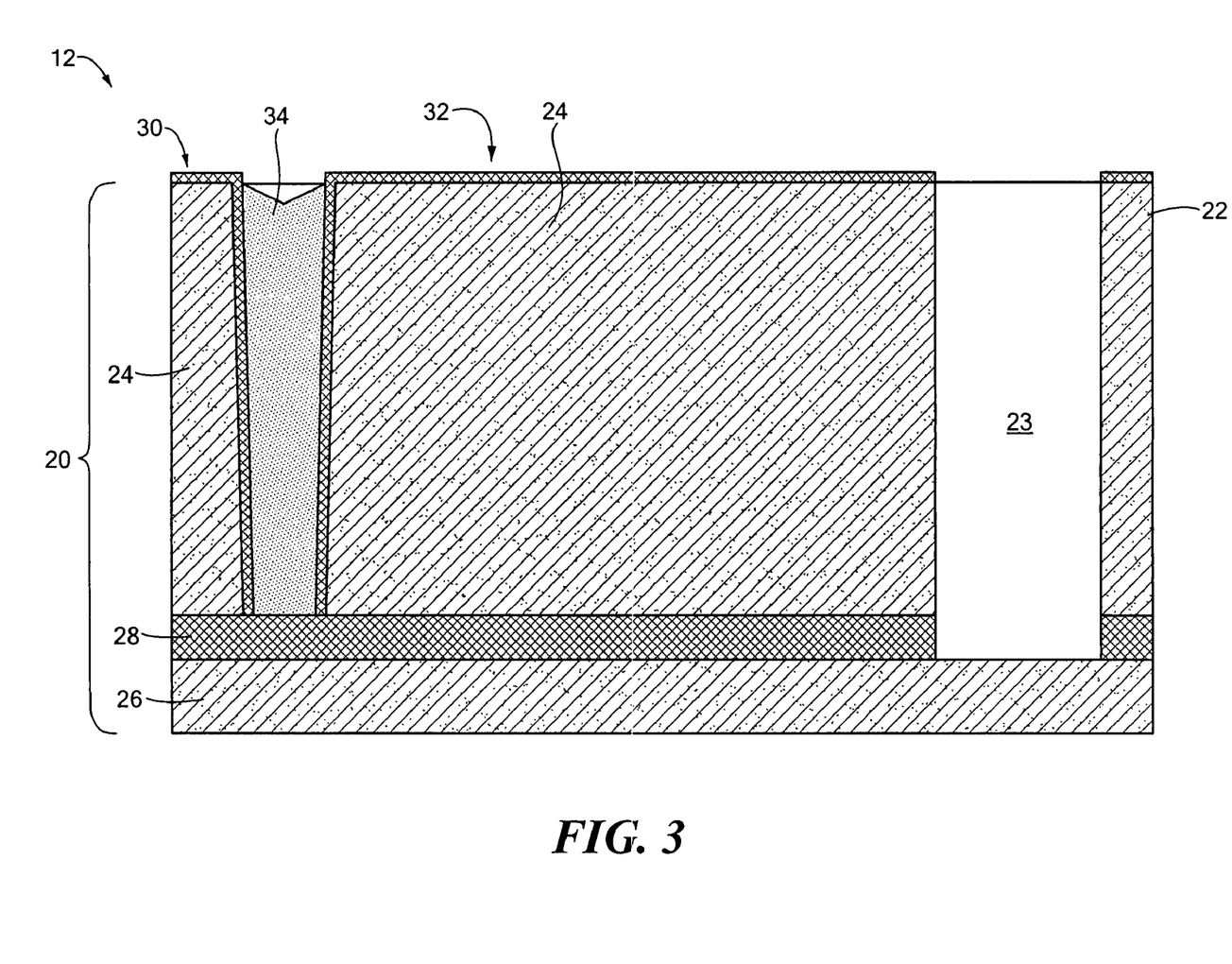
FIG. 3 schematically shows a soon to be completed MEMS device that may be processed in accordance with in illustrative embodiments of the invention.
Figure 4:
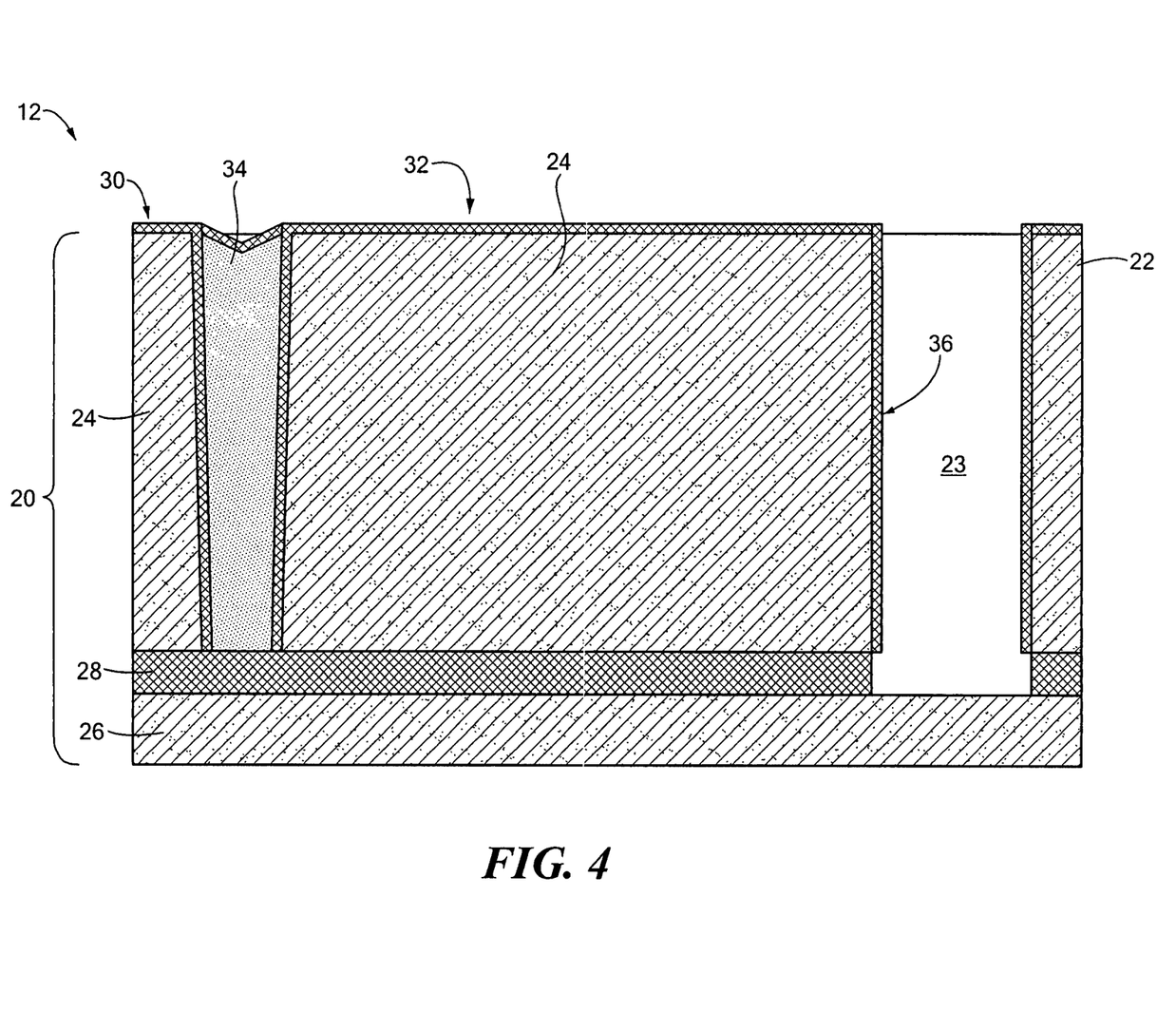
FIG. 4 schematically shows the MEMS device shown in FIG. 3 with a barrier layer as discussed with regard to step 202 of FIG. 2.

The process begins at step 200, which simply provides a MEMS device 12. As noted below, this MEMS device 12 can be released or unreleased, and/or include circuitry or be circuitry free. In addition, as noted above, the MEMS device 12 can be formed from any conventional process. FIG. 3 schematically shows a cross-sectional view of an exemplary MEMS device 12 that may be used with illustrative embodiments of the invention. The MEMS device 12 in this embodiment (at this point in the process) is formed from a SOI wafer 20 having fully formed but unreleased structure 22 on a device layer 24, a substrate 26 above which the structure 22 is to be suspended, and an insulator layer 28 between the substrate 26 and device layer 24.

The device layer 24 in this embodiment is considered to have both a circuitry portion 30 and a structure portion 32. At this point in the process, the circuitry portion 30 illustratively is electrically isolated from the remainder of the device layer 24 and thus, electrically isolated from the structure 22. To that end, the device layer 24 has a conventional nitride lined, polysilicon filled isolation trench 34 providing the necessary isolation. The polysilicon in the isolation trench 34 may be doped or undoped in the manner discussed below.

In the embodiments discussed, at this point in the process, the circuitry portion 30 has no circuitry. Instead, the circuitry will be formed in a later step, discussed below. In alternative embodiments, however, the MEMS device formed by this process has no circuitry on the same die as the structure 22. Those embodiments therefore may have no isolation trench 34. Accordingly, discussion of a MEMS device having circuitry on the same die is for illustrative purposes only and not intended to limit all embodiments.

FIG. 3 and subsequent figures show the structure 22 in a schematic manner only. For example, FIG. 3 and other figures schematically identify the structure 22 by referring to a generalized block. This block representing the structure 22 may be any structure, such as a movable mass suspended by a plurality of springs, interdigitated stationary and movable fingers, a flexible diaphragm, etc. . . . . . Among other things, exemplary structure 22 in the device layer 24 may be similar to that disclosed in the above noted incorporated patents.

The structure 22 forms a space between it and other components (e.g., between a stationary finger and the structure 22). Accordingly, the space is considered to be proximate to the structure 22. FIG. 3 and subsequent figures schematically show this space in one location as reference number 23. In a manner similar to the schematic representation of the structure 22, this schematic representation is not intended to suggest a shape or size of the space 23. Those skilled in the art should understand that the space 23 and structure 22 can have varying shapes and sizes. Among other places, such a space 23 may be between 1) the mass and the substrate 26, 2) the mass and stationary portions of the device layer 24 (e.g., actuate fingers on the mass and stationary actuation fingers of the device layer 24), 3) the mass and other movable portions, 4) springs and other portions of the device layer 24, and 5) springs and the substrate 26.

The process then continues to step 202, which adds a barrier layer 36 to the walls of the device layer 24 that bound the space 23. In illustrative embodiments, the barrier layer 36 should be sufficient to prevent a dry phase gas etch (performed for step 214, discussed below) from penetrating to the underlying silicon. To those ends, the surfaces of the device layer 24 exposed to the atmosphere may be oxidized in a conventional manner (see FIG. 4, which shows the barrier layer 36 in the space 23). In illustrative embodiments, this step forms an oxide layer having a thickness of between about 500-1000 Angstroms.

Figure 5:
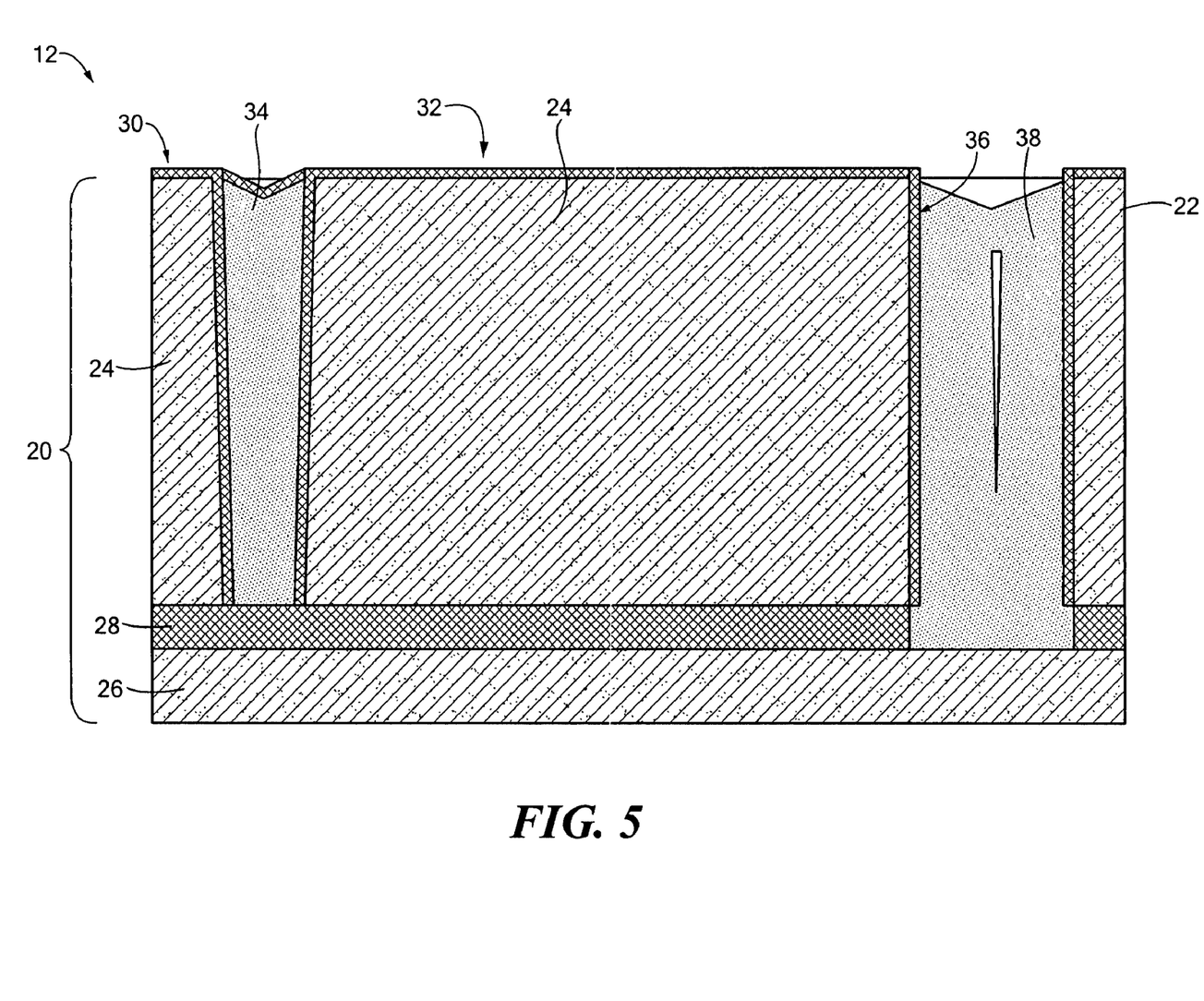
FIG. 5 schematically shows the processed MEMS device of FIG. 4 with fill material as discussed with regard to step 204 of FIG. 2.

The process then may add sacrificial/fill material 38 to at least some of the spaces 23 in the MEMS device 12 (step 204, see FIG. 5). Even if the MEMS device structure 22 were released before this step, this step still would substantially immobilize the structure 22. As discussed above, the spaces 23 include those between the different stationary and movable parts of the MEMS device 12. The process illustratively deposits sacrificial material 38 in all spaces 23 (i.e., around and below the structure 22), thus essentially transforming the MEMS device 12 into a substantially solid block of various materials.

In illustrative embodiments, the sacrificial material 38 is a sublime material, which changes from a solid state to a gaseous state without going through an intermediate liquid stage. As an example, in the embodiments shown, the sacrificial material 38 is polysilicon. Accordingly, the barrier layer 36 formed by step 202 acts as a barrier between the underlying structure 22 and the sacrificial material 38. Stated another way, the barrier layer 36 separates the structure 22 from the sacrificial material 38. Accordingly, the barrier layer 36 ensures that the underlying structure 22 is not removed or otherwise contacted/damaged when the sacrificial material 38 is removed (discussed below). Of course, alternative embodiments may use other sacrificial materials, such as waxes or polymers.

In accordance with illustrative embodiments, the sacrificial material 38 is doped in a prescribed manner. For example, conventional techniques first may pre-dope the device layer 24 so that it has a nonuniform doping ranging between $10^{19}$ carriers per centimeter cubed at the top surface, and $10^{18}$ carriers per centimeter cubed at the interface between the insulator layer 28 and the device layer 24. Among other ways, this predoping may be applied via the top surface of the layer, which causes this nonuniform doping. Accordingly, the sacrificial material 38 may be doped so that after it is added to the space 23, the structure portion 32 of the device layer 24 has a substantially uniform doping, such as $10^{19}$ carriers per centimeter cubed. In an anticipated embodiment, the barrier layer 36 in the space 23 may have a thickness of about 500 Angstroms, while the space 23 may have a width of between about 1.5-2.0 microns. Consistent with goals of various embodiments, this barrier layer 36 thickness should sufficiently prevent a gas phase etch from contacting the structure 22 while ensuring that the sacrificial material 38 can provide the desired doping effect.

At this point in the process, the structure 22 of the MEMS device 12 is substantially immobile. Accordingly, the MEMS device 12 may be subjected to various post processing processes. Among others, those processes may include the following:

forming circuitry to the device layer 24,
adding a ground plane electrode,
depositing an in-situ cap MEMS device 12,
adding more MEMS structures,
adding assembly features, such as flip chip landing sites, bump bonds, and other similar items,
adding a metal interconnect (e.g., a floating metal/oxide bridge) across the sacrificial material 38 to electrically connect the structure 22. This bridge remains in place after the sacrificial material 38 is removed to provide an electrical connection to the structure 22.

Figure 6:
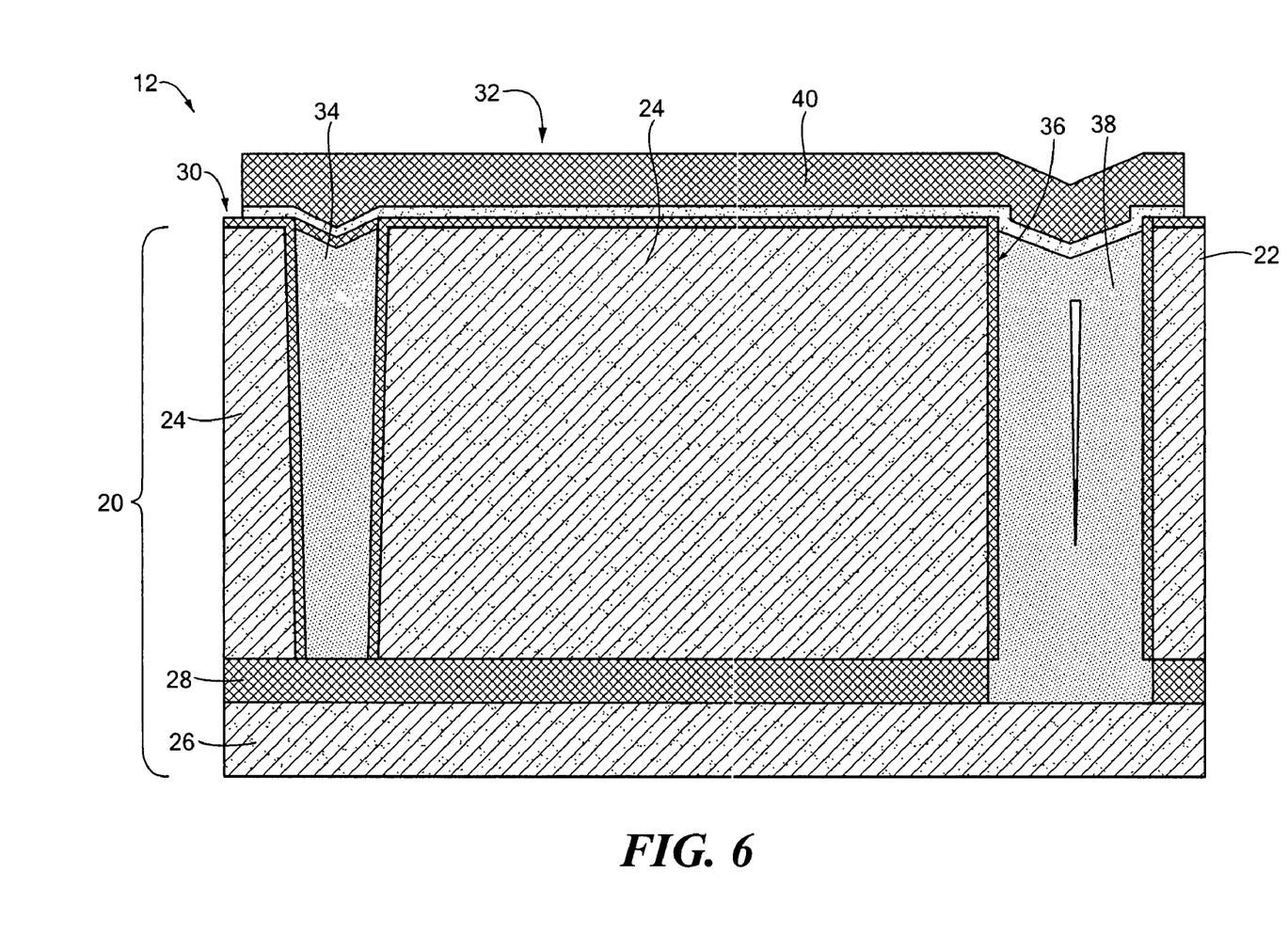
FIG. 6 schematically shows the addition of a cap to the processed MEMS device of FIG. 5 as discussed with regard to step 206 of FIG. 2.

To protect the structure 22, the process may form a temporary cap 40 (step 206, FIG. 6). The cap 40 shown in FIG. 6 has a nitride layer supporting a thick oxide layer. The process thus continues to step 208, which determines whether circuitry is to be added to MEMS device 12. If circuitry is to be added, then the process continues to step 210, which adds circuitry (not shown) to the circuitry portion 30 of the device layer 24 in a conventional manner. Illustrative embodiments may form BIMOS circuitry in the circuitry portion 30 of the device layer 24.

Figure 7:
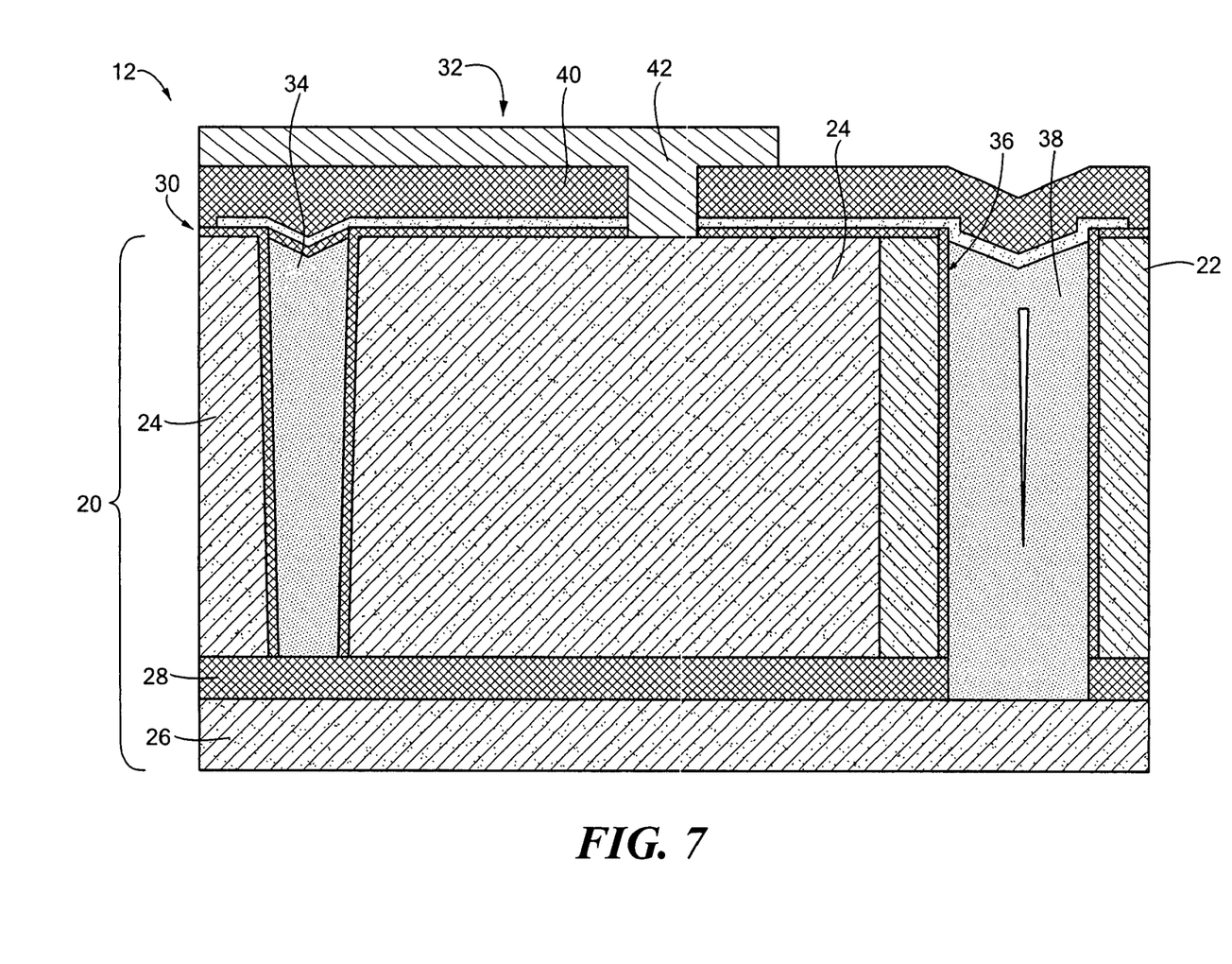
FIG. 7 schematically shows the addition of a contact to the processed MEMS device of FIG. 6 as discussed with regard to step 212 of FIG. 2.
Figure 8:
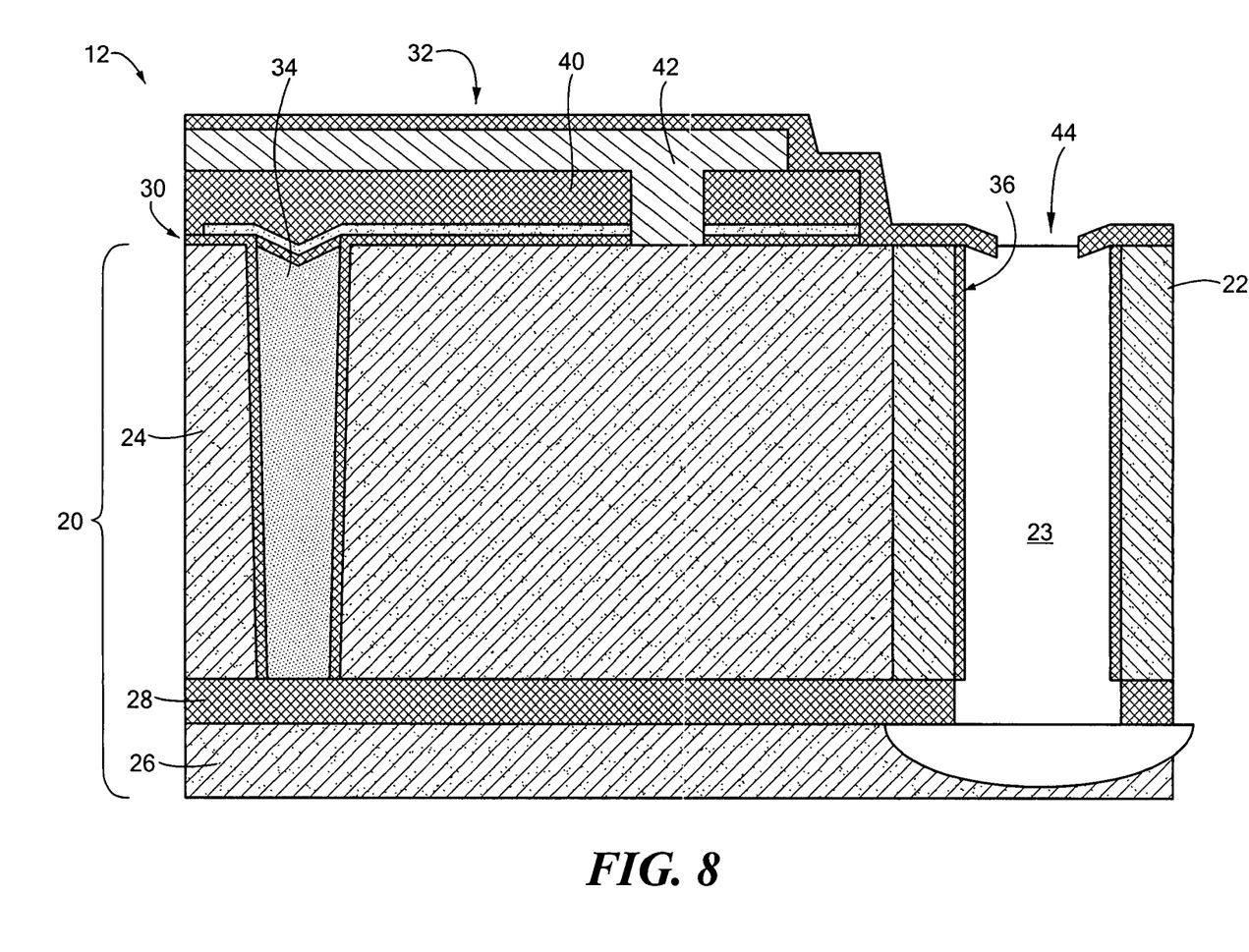
FIG. 8 schematically shows removal of the fill material from to the MEMS device of FIG. 7 as discussed with regard to step 214 of FIG. 2.

Conventional metallization processes then may form metal contacts 42 to permit electrical interconnection (step 212 and FIG. 7). After post-processing steps are completed, the sacrificial material 38 may be removed, thus re-releasing the structure 22 in those embodiments that were released before the sacrificial material 38 was added (step 214 and FIG. 8). Accordingly, this restores the spaces 23 occupied by the sacrificial material 38, thus permitting the structure 22 in those embodiments to move again relative to the substrate 26. To those ends, as shown in FIG. 8, a plurality of etch access holes 44 may be formed through the oxide layers 34B and 34C to contact the sacrificial polysilicon 36.

In illustrative embodiments, a low temperature process removes the sacrificial material 38. If the MEMS device 12 includes circuitry, then the low temperature processes should be performed at a temperature that should not adversely affect the circuitry. For example, if temperatures above about 400 degrees C. could adversely affect circuitry, then such processes should be less than about 400 degrees C. In the case of polysilicon, a dry gas phase etch using xenon difluoride should suffice. As known by those in the art, this dry phase gas phase etch process can be performed at room temperature. Higher temperatures may be used, however, to improve processing. Such higher temperatures illustratively are lower than some determined maximum that could impact other components (e.g., lower than 400 degrees C.).

As noted above, in some embodiments, the structure 22 may not have been fully released when step 200 provided the MEMS device 12. For example, the insulator layer 28 may not have been removed in a manner that releases the structure 22. In that case, in addition to removing the sacrificial layer, the dry phase gas etch may be directed toward the substrate below the insulator layer 28. Removing portions of the substrate (below the structure 22) thus releases the structure 22—even though the insulator layer 28 below such structure 22 remains. In illustrative embodiments, the substrate is much thicker than the device layer 24, such as on the order of 15-60 times thicker. For example, the device layer 24 may be about 10 microns thick, while the substrate (before this step) may be about 600 microns thick. In those instances, a generous amount of the substrate may be coarsely removed without adversely affecting the ultimately produced MEMS device 12.

In alternative embodiments where the structure 22 is not yet released, however, the structure 22 is released by conventional means, such as by removing selected portions of the insulator layer 28.

Figure 9:
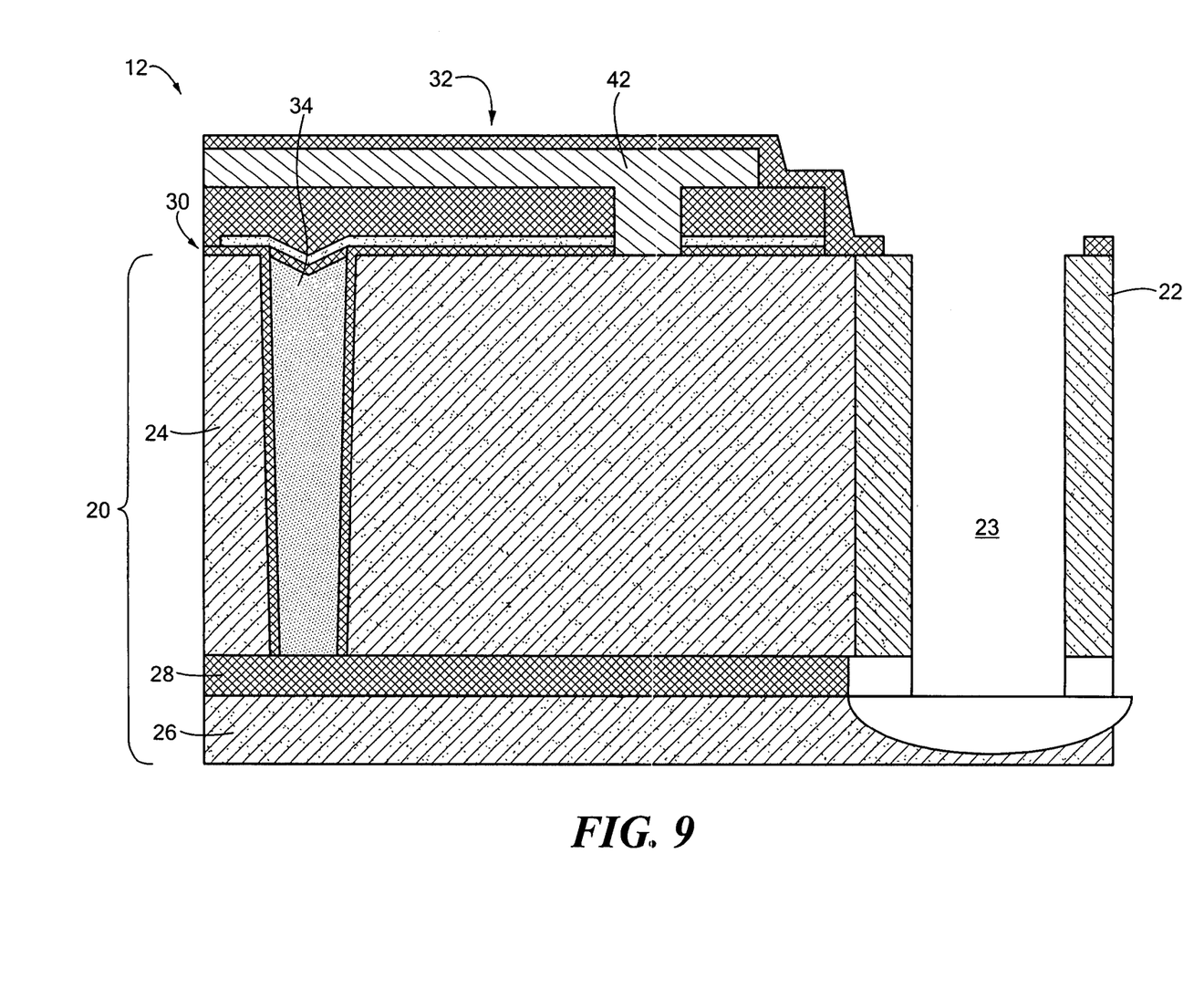
FIG. 9 schematically shows the MEMS device of FIG. 8 with the barrier layer substantially removed as discussed with regard to step 216 of FIG. 2.

The process thus concludes at step 216, which removes at least a portion of the barrier layer 36, as shown in FIG. 9. To that end, in illustrative embodiments, the MEMS device 12 may be subjected to a short HF dip. The HF dip preferably does not remove much of the insulator layer 28, which is much thicker than the barrier layer 36.

As a result of this lateral doping, the device layer 24 may be substantially uniformly doped. Moreover, in the embodiments that do not provide a released (SOI) MEMS device 12, a portion of the substrate is removed to release the structure 22.

Although the above discussion discloses various exemplary embodiments of the invention, it should be apparent that those skilled in the art can make various modifications that will achieve some of the advantages of the invention without departing from the true scope of the invention.

What is claimed is:

1. A method of producing a MEMS device, the method comprising:

providing an intermediate multi-layer apparatus having an insulator layer between a first layer and a semiconductor wafer substrate, the first layer having structure and wherein the first layer has a space proximate to the structure;

adding a barrier layer to the space before adding a doped material, the barrier layer adapted to allow the doped material to dope at least a portion of the first layer and to prevent a dry phase etch from affecting the structure;

adding the doped material to the space such that the barrier layer is between the doped material and the structure;

doping at least a portion of the first layer; and removing at least a portion of the doped material.

2. The method as defined by claim 1, further including removing at least a portion of the semiconductor wafer substrate to release the structure.

3. The method as defined by claim 2 wherein removing includes applying a dry gas phase etch to the doped material.

4. The method as defined by claim 1, wherein the semiconductor wafer substrate includes a single crystal wafer.

5. The method as defined by claim 1 wherein the apparatus is a silicon-on-insulator wafer.

6. The method as defined by claim 1 further including releasing the structure before adding the doped material.

7. The method as defined by claim 1 wherein the first layer has a stationary portion, the space being between the structure and the stationary portion.

8. The method as defined by claim 1 wherein the first layer has a thickness that is greater than or equal to about 10 microns.

* * * * *